United States Patent [19]
Pascucci

[11] Patent Number: 5,881,001
[45] Date of Patent: Mar. 9, 1999

[54] DATA SENSING TIMING MODULATING CIRCUIT, PARTICULARLY FOR NON-VOLATILE MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 825,098

[22] Filed: Mar. 27, 1997

[30] Foreign Application Priority Data

Mar. 29, 1996 [EP] European Pat. Off. ............... 96830165

[51] Int. Cl.$^6$ ................................................. G11C 7/00
[52] U.S. Cl. ............................................ 365/194; 365/233
[58] Field of Search ............................... 365/233, 194

[56] References Cited

U.S. PATENT DOCUMENTS

| | | | |
|---|---|---|---|
| 4,628,487 | 12/1986 | Smayling | 365/185 |
| 4,687,951 | 8/1987 | McElroy | 307/269 |
| 4,727,519 | 2/1988 | Morton et al. | 365/233 |
| 5,003,203 | 3/1991 | Win et al. | 307/465 |
| 5,218,571 | 6/1993 | Norris | 365/189.09 |
| 5,608,676 | 3/1997 | Medlock et al. | 365/189.09 |
| 5,657,269 | 8/1997 | Nanamiya | 365/194 |

FOREIGN PATENT DOCUMENTS

A-0 175 101  3/1986  European Pat. Off. ........ G11C 11/24

*Primary Examiner*—David Nelms
*Assistant Examiner*—M. Tran
*Attorney, Agent, or Firm*—Wolf, Greenfield & Sacks, P.C.

[57] ABSTRACT

A data sensing timing modulating circuit, particularly for non-volatile memories. The circuit includes means for generating a first voltage (V=f(Icell)) that is a function of the conductivity of a memory cell and of a second substantially constant reference voltage (V=Vref), a first delay circuit, and a second delay circuit supplied by the first and second voltages. The first delay circuit modulates, as a function of the first voltage, the start time of the switching of an equalization signal that is normally present in the memory device. The switching of this signal indicates the beginning of a data sensing step. The second delay circuit modulates the slope of the switching of the equalization signal, as a function of the first voltage, so as to determine the instant when the equalization signal ends the switching to start the subsequent data sensing step.

31 Claims, 4 Drawing Sheets

DATA SENSING TIMING MODULATING CIRCUIT, PARTICULARLY FOR NON-VOLATILE MEMORIES

BACKGROUND OF THE INVENTION

1. Field of the Invention

The present invention relates to a data sensing timing modulating circuit, particularly for non-volatile memories.

2. Discussion of the Related Art

It is known that in memories which use dynamic sense amplifiers, and similarly with static amplifiers, i.e., amplifiers that do not read the data of the memory at particular times and therefore allow reading at any freely selectable time, it is very important to determine the moment of data sensing and the sensitivity of the amplifier, i.e., the timing of the control step meant to capture the data, so as to obtain the best possible result in any operating condition.

The sensing step generally follows a first precharge step that very quickly brings the bit lines to which the various memory cells are connected to the operating level and equalizes them. Indeed, because they are equalized, these lines must then have time enough to assume a difference, however small, allowing certain and correct data reading.

The time intervals that determine a timing for reading a non-volatile memory are not absolute but depend on a certain number of variables, such as:

the conductivity characteristics of the memory cells;

the levels transmitted to the cells at the given instant;

the capacitance of the associated lines;

the minimum sensitivity of the sense amplifiers;

the impedances of the memory access paths;

the presence/absence of supply voltage boosting circuits; and the operating temperature.

It is thus evident that it is not possible to establish beforehand a given data sensing timing, with the purpose of optimizing the read times of a memory device. Even if one considerably expands the timing of the sensing step, with a consequent slowing of the data capture, the case may in fact occur in which the levels transmitted to the cells are still insufficient to determine their possible conductivity, and if one proceeded with the reading operation, the result would be unreliable. A memory device with scarcely conductive cells requires a longer settling time than a similar device with more conductive cells.

In any case, the sensing step must be followed by a data capture step that must be performed as quickly as possible. European patent application no. 95830336.4 filed on Jul. 28, 1995 in the name of the same Applicant disclosed a circuit for generating a signal with a slope capable of being modulated, which is a function of the conductivity of a memory cell. Slope modulation is therefore performed in close correlation with the conductivity of the memory cell. This application is incorporated herein by reference.

One object of the present invention is therefore to provide a data sensing timing modulating circuit, particularly for non-volatile memories, that is capable of modulating the data sensing and capture times as a function of the conductivity of the memory cells.

Another object of the present invention is to provide a data sensing timing modulating circuit, particularly for non-volatile memories, that is capable of correlating the moment when the data sensing step starts to the conductivity of the memory cells.

Another object of the present invention is to provide a data sensing timing modulating circuit, particularly for non-volatile memories, that allows optimization of the sensitivity of the sense amplifiers of the memory device, as a function of the conductivity of the memory cells of said device.

Another object of the present invention is to provide a data sensing timing modulating circuit for a memory device that allows suspension and delay of the timing of the extraction of the data item if the minimal conditions for correct and certain reading are not achieved.

Another object of the present invention is to provide a data sensing timing modulating circuit for a memory device, which allows modulation of the data sensing timing according to the voltage applied to the memory device at a given instant.

Another object of the present invention is to provide a data sensing timing modulating circuit that allows modulation of the timing of the data according to the operating temperature of the memory device at a given instant.

Another object of the present invention is to provide a data sensing timing modulating circuit that allows modulation of data timing according to the intrinsic conductivity characteristics of the memory device.

Another object of the present invention is to provide a data sensing timing modulating circuit that allows modulation of the data timing according to the technological and process characteristics used in the memory device.

Another object of the present invention is to provide a sensing timing modulating circuit for the data of a memory device that is highly reliable and relatively easy to produce at competitive costs.

SUMMARY OF THE INVENTION

These objects, and other objects which will become apparent hereinafter are achieved by a data sensing timing modulating circuit, particularly for non-volatile memories, comprising means for generating a first voltage that is a function of the conductivity of a memory cell and generating a second substantially constant reference voltage, and a first delay circuit and a second delay circuit supplied by the first and second voltages. The first delay circuit is adapted to modulate, as a function of the first voltage, the start time of the switching of an equalization signal that is normally present in the memory device, the switching of the signal indicating the beginning of a data sensing step. The second delay circuit is adapted to modulate the slope of the switching of the equalization signal, as a function of the first voltage, so as to determine the instant when the equalization signal ends the switching to start the subsequent data sensing step.

BRIEF DESCRIPTION OF THE DRAWINGS

Further characteristics and advantages of the invention will become apparent from the description of a non-limiting embodiment of a circuit according to the invention, illustrated by way of non-limiting example in the accompanying drawings, wherein.

With reference to the above figures, the circuit according to one embodiment of the invention comprises voltage generating means I that are adapted to generate two voltages, one that is a substantially constant reference voltage. The voltages are designated by Vref=f(Icell) and V=f(Icell). The second voltage is a function of the conductivity of an elementary cell, which reproduces a generic memory cell of a memory device. The first voltage Vref is instead substantially constant as the conductivity of the elementary cell varies.

Voltages Vref and V=f(lcell) produced by the voltage generation means 1 are sent simultaneously and respectively to a first delay circuit 2 and to a second delay circuit 3.

Advantageously, the first and second delay circuits 2 and 3 both include a circuit for generating a signal the slope of which can be modulated as a function of the conductivity of a memory cell.

The first delay circuit 2 receives the precharge signal Pcn as an input, in addition to the two voltages generated by the voltage generating means 1, and outputs a first signal UST the delay of which can be modulated. Signal UST is fed as an input to the second delay circuit 3.

The signal UST generated by the first delay circuit is a signal in which the transition from 0 to 1 is a function of the conductivity of the memory cell affected by the reading operation. This signal sets a delay time that determines the beginning of the switching, with a variable slope, of the equalization signal.

The output of the second delay circuit 3 is taken from a node with a modulated slope, so as to generate a signal the slope of which can be modulated, i.e, the equalization signal EQ modulated appropriately as a function of the conductivity of the cell. Therefore, this second delay circuit modulates the slope of the equalization signal, while the equalization signal switches from high to low, as a function of the conductivity of the involved memory cell.

Figure 1:
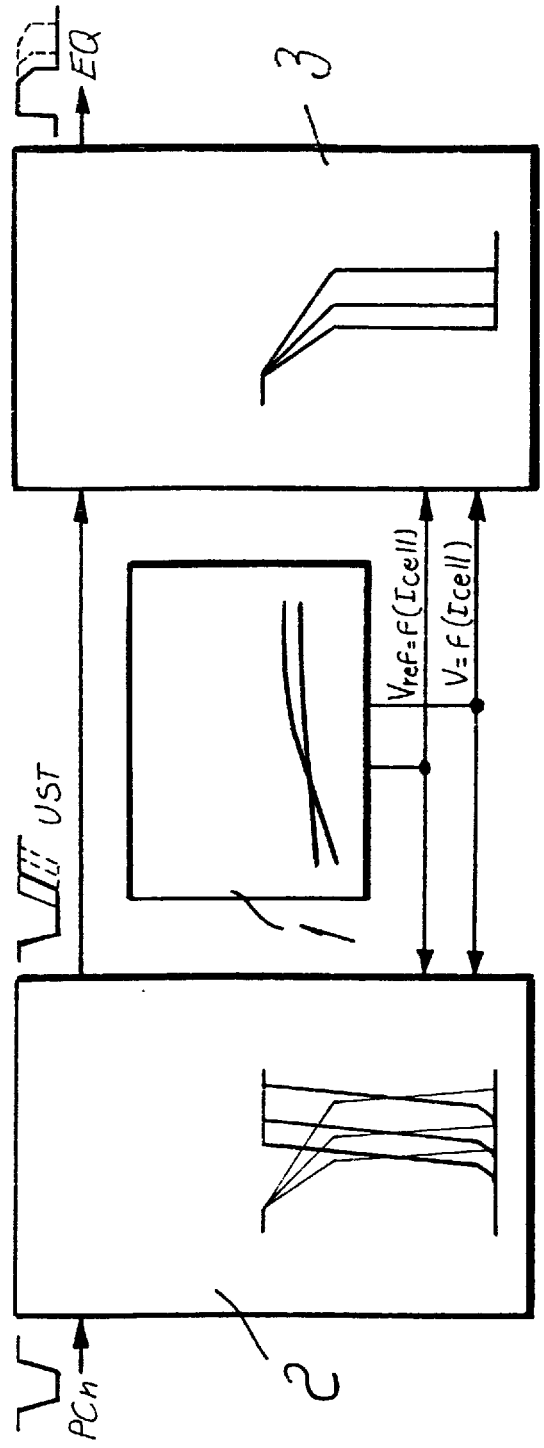
FIG. 1 is a block diagram of the circuit according to one illustrative embodiment of the invention.
Figure 2:
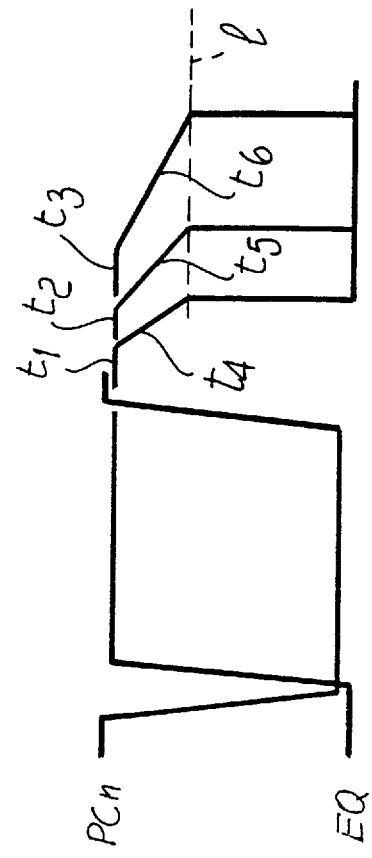
FIG. 2 is a chart of the timings of the circuit of FIG. 1.

FIG. 2 plots the timing of the precharge and equalization signals PCn and EQ. The three delays $t_1$, $t_2$, and $t_3$ show three different modulations of the starting point of the switching of the signal EQ as a function of three different conductivity values of the memory cell.

The delay $t_1$, corresponds to the most conductive cell, whereas the delay $t_3$ corresponds to the least conductive cell.

The delays $t_4$, $t_5$, and $t_6$ correspond respectively to the modulation of the sensitivity of the sense amplifier as a function of the conductivity of the current. In this case, $t_4$ defines the lowest sensitivity of the sense amplifier, whereas $t_6$ refers to a higher sensitivity than $t_4$.

The delays $t_4$, $t_5$, and $t_6$, designated by the output signal EQ of the second delay circuit 3, determine the slope with which the signal EQ switches. The line 1 defines the time of assured data capture, which must therefore be instantaneous. The signal EQ then switches suddenly to zero from this line onward.

Figure 3:
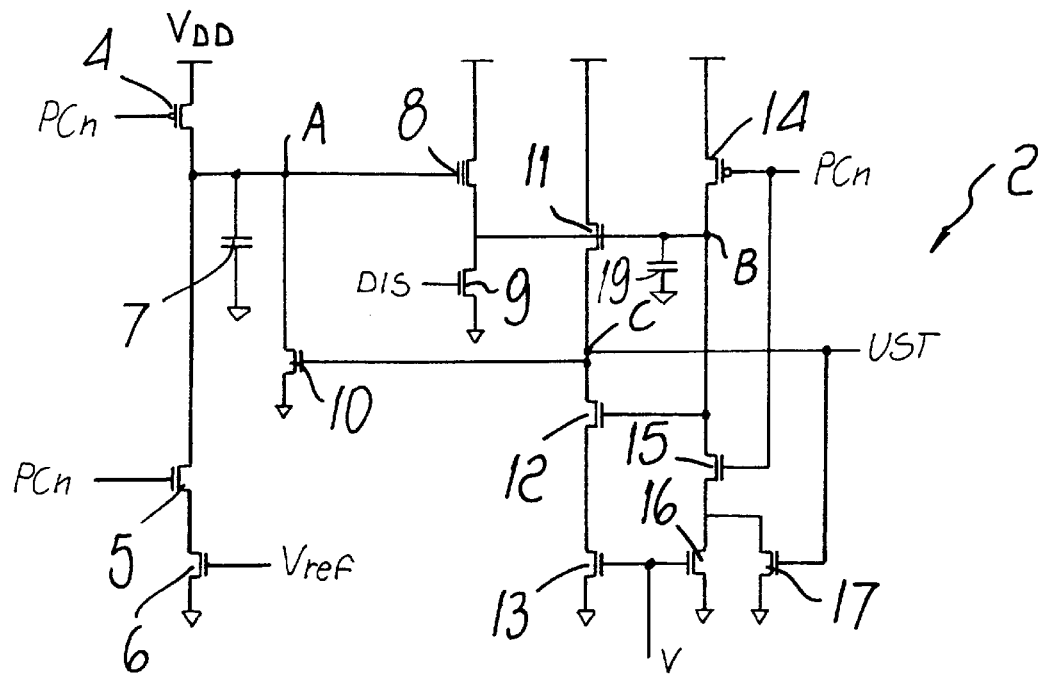
FIG. 3 is a circuit diagram of a portion of the circuit according to the embodiments of the invention shown in FIG. 1.
Figure 4:
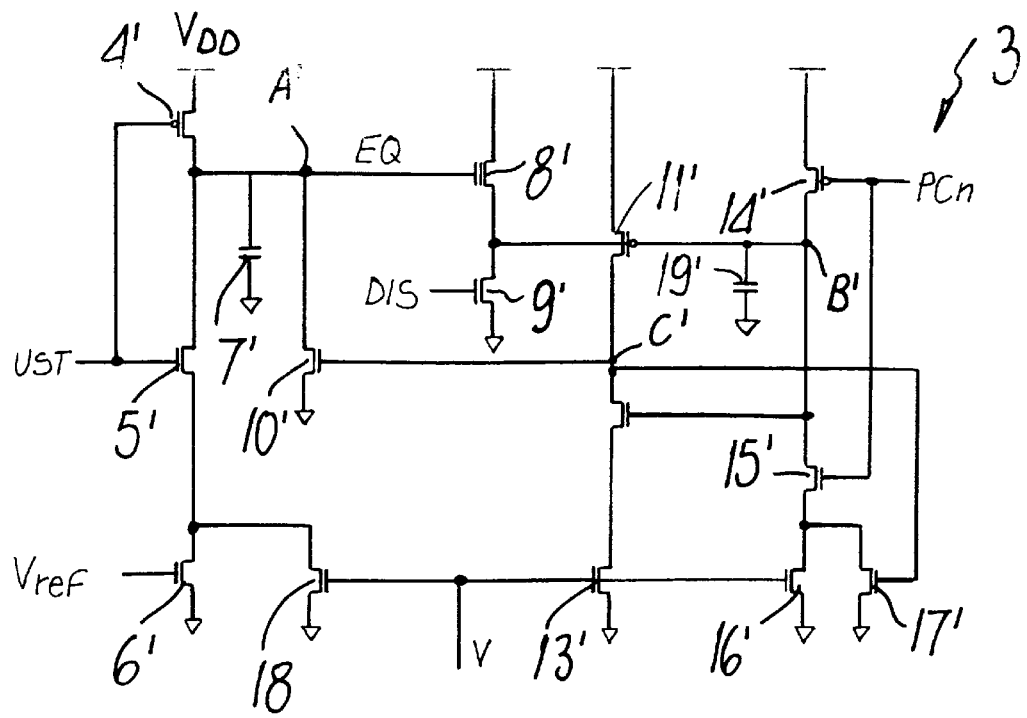
FIG. 4 is a circuit diagram of another portion of the circuit according to the embodiment of the invention shown in FIG. 1.

With reference to FIGS. 3 and 4, the figures illustrate one embodiment of the two delay circuits 2 and 3.

The two circuits are substantially identical, and accordingly only the circuit 2 will be described, assigning the same reference numerals to identical elements in the two circuits 2 and 3. For circuit 3, said reference numerals will be primed.

With reference to FIG. 3, the delay circuit 2 comprises a first P-channel transistor 4 and a second N-channel transistor 5. The signal PCn is sent to the gate terminals of the transistors 4 and 5. The source terminal of the transistor 4 is connected to the supply voltage $V_{DD}$ and its drain terminal is connected to the drain terminal of the transistor 5. The source terminal of the transistor 5 is connected to the drain terminal of a third N-channel transistor 6, the gate terminal of which receives the reference voltage Vref generated by the voltage generating means 1. The drain terminal of the transistor 6 is connected to the ground. Capacitive means 7 are connected between the source terminal of the transistor 4 and the ground. A fourth transistor of the native N-channel type 8 and a fifth N-channel transistor 9 are interposed between the supply voltage $V_{DD}$ and the ground. In particular, the drain terminal of the transistor 8 is connected to the supply voltage, its gate terminal is connected to the source terminal of the transistor 4, and its source terminal is connected to the drain terminal of the transistor 9.

A control signal DIS, adapted to disable or enable the circuit, is sent to the gate terminal of the transistor 9. The source terminal of the transistor 9 is connected to ground.

There is a sixth N-channel transistor 10, in which the drain terminal is connected to the gate terminal of the transistor 8 and the source terminal is connected to the ground. The gate terminal of the transistor 10 is connected to a branch that comprises a seventh, an eighth, and a ninth transistor, designated respectively by the reference numerals 11, 12, and 13. The transistor 11 is of the P-channel type and the transistors 12 and 13 are of the N-channel type.

The source terminal of the transistor 11 is connected to the supply voltage $V_{DD}$ and its gate terminal is connected to the line that connects the source and drain terminals of the transistors 8 and 9 respectively. The drain terminal of the transistor 11 is connected to the drain terminal of the transistor 12. The source terminal of the transistor 12 is connected to the drain terminal of the transistor 13, the source terminal of which is connected to the ground. The gate terminal of the above-described transistor 10 is connected to the line that connects the source terminal and the drain terminal of the transistors 11 and 12 respectively.

The gate terminals of the transistors 11, 12, and 13 are connected to a second branch of the circuit, which comprises a tenth, an eleventh, and a twelfth transistors, designated by the reference numerals 14, 15, and 16 respectively. The transistor 14 is of the P-channel type, whereas the transistors 15 and 16 are of the N-channel type. The gate terminal of the transistor 11 is also connected to the ground by means of a capacitor 19.

The source terminal of the transistor 14 is connected to the supply voltage, whereas its drain terminal is connected to the drain terminal of the transistor 15, the source terminal of which is connected to the drain terminal of the transistor 16. The source terminal of the transistor 16 is connected to the ground. The signal PCn is sent to the gate terminals of the transistors 14 and 15.

The gate terminals of the above-described transistors 11, 12, and 13 are respectively connected to the line that connects the drain terminals of the transistors 14 and 15 (for the gate terminals of the transistors 11 and 12) and to the voltage signal V, which is a function of the conductivity of the memory cell and is generated by the voltage generating means 1.

The signal UST is emitted by the output node C of the circuit of FIG. 3 and is fedback as an input to the gate terminal of a thirteenth N-channel transistor 17, the drain and source terminals of which are respectively connected to the line that connects the source terminal and the drain terminal of the transistors 15 and 16 and to the ground.

The circuit of FIG. 4 is, as mentioned, similar to the circuit of FIG. 3, except for the presence of an additional N-channel transistor 18 that is connected, by means of its drain terminal, to the line for connecting the source and drain terminals of the transistors 5' and 6'. The source terminal is connected to the ground. The voltage signal V, which is a function of the conductivity of the memory cell, is sent to the gate terminal of the transistor 18. The charts of FIGS. 5 and 6 will be explained with reference to the operation of the circuit according to one embodiment of the invention. With reference to the above figures, the operation of the circuit according to one embodiment of the invention is as follows.

The operation of circuit 2 is similar to the operation of the circuit 3. The difference between the two circuits is the fact that the circuit 3 receives, as an input to the transistors 4' and 5', the signal UST produced by the circuit 2, instead of the signal PCn, that circuit 2 receives.

The voltage generating means 1 generates a first voltage V=f(Icell) that is a function of the conductivity of the memory cell, and a second substantially constant voltage Vref; these voltages are fed to the gate terminals of the transistors 6, 13, 16, and 6', 18, 13', 16', for the first delay circuit 2 and for the second delay circuit 3, respectively.

In the inactive situation, i.e., when a precharging step is not in progress (PCn=1), the nodes A and B of the circuit 2 are low, whereas the node C is high. When the signal PCn switches from high to low (i.e., during the precharging step: PC1), the transistors 4 and 14 are on and the transistors 5 and 15 are off. The node A of the circuit 2 is high (at $V_{DD}$) and so is the node B.

The control signal DIS is set to zero when PCn is low. The output signal UST (i.e., the node C) starts from zero when PCn switches to zero. Thus, to summarize, when PCn switches from high to low the nodes A and B are high and the node C is low.

When PCn switches to the high level, the transistor 4 is off, the transistor 5 is on, the transistor 14 is off, and the transistor 15 is on. The capacitor 7 that had charged begins to discharge with a constant current, which is determined by the substantially constant reference voltage Vref.

At this point the voltage level of the node A starts to decrease in a linear fashion. Likewise, the node B also decreases in level, but remains below the level of the node A by a threshold that is determined by the threshold voltage of the N-channel transistor 8.

The voltage level of the node B is applied to the gate terminal of the P-channel transistor 11. When the threshold level of the transistor 11 is reached, said transistor switches on and the node C rises slowly at first and then quickly, while the node B drops to zero together with the node A.

Figure 6:
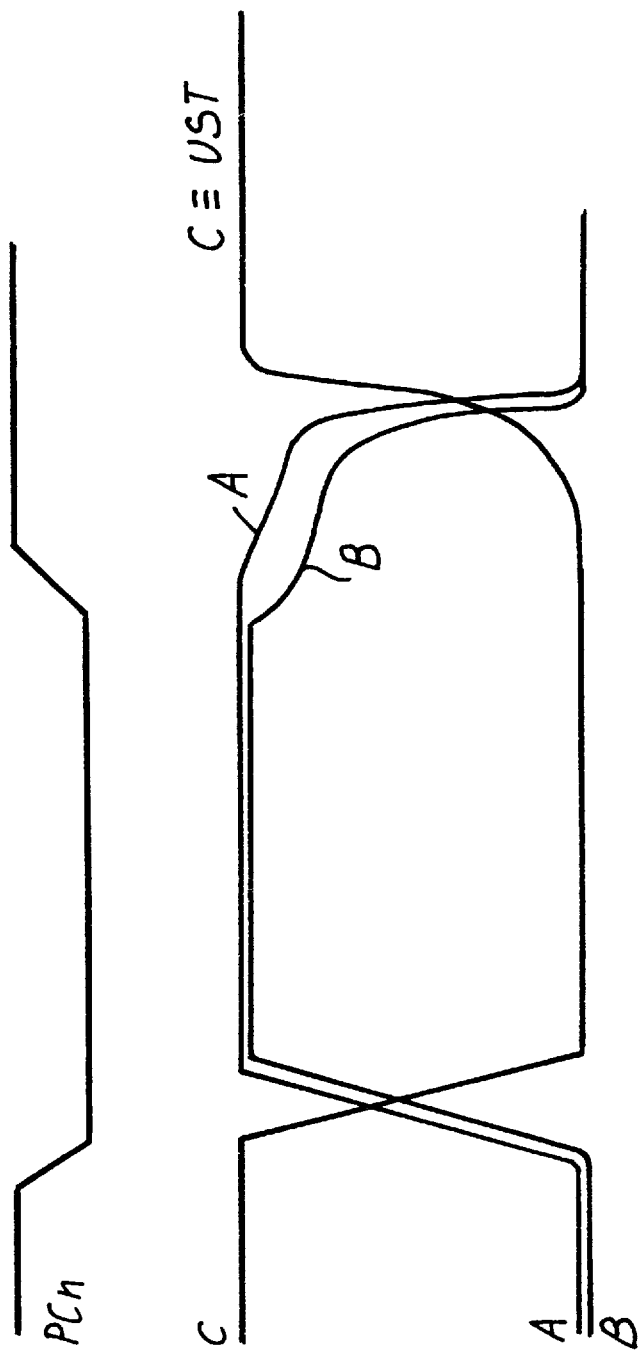
FIG. 6 is another chart of the timings of signals of a portion of the circuit according to the embodiment of the invention shown in FIG. 1.

This behavior of the nodes A, B, and C is shown by way of example in FIG. 6. The signal UST (given by the behavior of the node C) output from the circuit 2 is fed to the circuit 3. For the second circuit 3, the node the behavior that must be plotted is the node A', which is the node corresponding to A. If there is no current in the memory cell, the node B does not drop, since the voltage V=f(Icell) does not activate the transistors 13 and 16.

The circuit 2 then produces an output signal UST, the delay of which is set by the conductivity of the cell and constitutes a delay that can be modulated for the start of the drop (switching to zero) of the signal EQ output from the circuit 3.

The modulation of the time of activation of the signal UST therefore leads to a delay for the signal EQ, whereas the slope that can be modulated, which can be obtained from the circuit 3 in a manner similar to the one described for the circuit 2 since the two circuits are identical, is the actual slope with which the signal EQ is brought to zero, and is always a function of the conductivity of the memory cell involved in the reading operation.

The delay of the signal EQ is given, by way of example, by the reference signs $t_1$, $t_2$, and $t_3$ of FIG. 2 for three different values of the conductivity of the memory cell.

Figure 5:
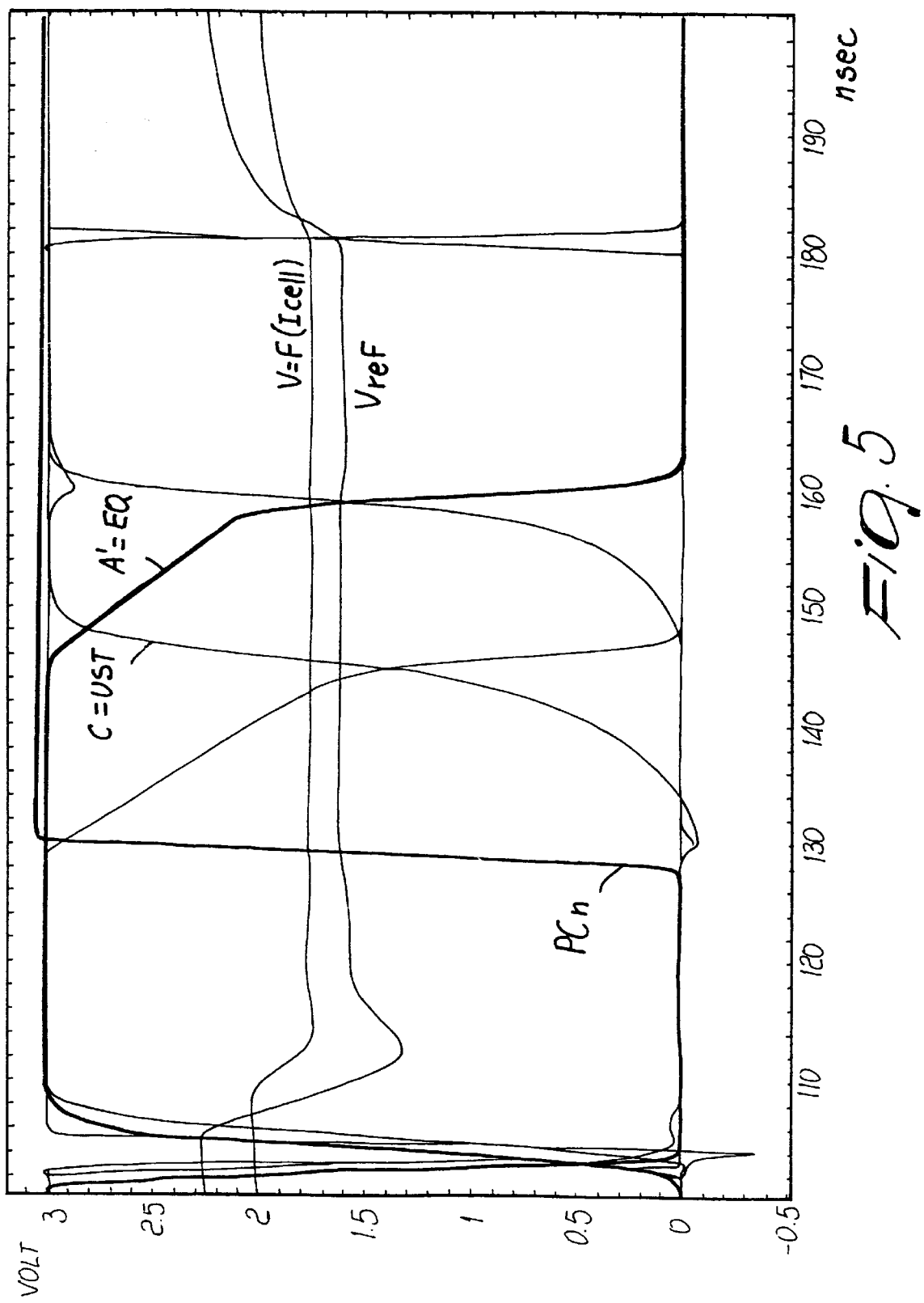
FIG. 5 is a chart of the timings of signals of the circuit according to the embodiment of the invention shown in FIG. 1.

The signal EQ, i.e., the behavior of the node A' of FIG. 4, is exemplified in FIG. 5. The second circuit 3 therefore produces a signal EQ that has the purpose of modulating the sensitivity of the sense amplifier as a function of the conductivity of the memory cell. The variable slope of the signal EQ is indicated by the reference signs $t_4$, $t_5$, and $t_6$ of FIG. 2 for the same conductivity values of the memory cell mentioned above.

In practice it has been observed that the circuit according to the invention fully achieves the intended aim, since it allows modulation of the sensing timing of the data of a memory device as a function of the conductivity of the memory cells involved in the reading operation.

Therefore, the circuit according to the invention allows determination of the instant (and therefore the delay) when the equalization signal must start to switch from high to low, as well as the slope with which this switching must occur, as a function of the conductivity of the memory cells.

In this manner, sensing timing is highly flexible and independent of the particular technology being used, and is instead closely tied to the supply voltage applied to the device at reading time. Data reading is therefore performed with the best timing for the conditions that are present for the memory device.

The circuit thus conceived is susceptible of numerous modifications and variations, all of which are within the scope of the inventive concept.

For example, the two voltages Vref and V=f(Icell) can be swapped without altering the inventive concept.

Furthermore, the first delay means can be replaced with any delay network. as long as its delay is linked to the conductivity of a non-volatile matrix cell, i.e., be modulated by a cell current. Finally, all the details may be replaced with other technically equivalent elements.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A data sensing timing modulating circuit for a memory, comprising:
    means for generating a first voltage that is a function of a conductivity of a memory cell of the memory, and a second reference voltage;
    a first delay circuit; and
    a second delay circuit supplied by said first and second voltages, said first delay circuit being adapted to modulate, as a function of said first voltage, a start time of a switching of an equalization signal that is normally present in the memory, the switching of said equalization signal indicating a beginning of a data sensing step, said second delay circuit being adapted to modulate the slope of the switching of said equalization signal, as a function of said first voltage, so as to determine an instant when said equalization signal ends to start a subsequent data sensing step.

2. The circuit according to claim 1, wherein said first delay circuit is adapted to generate a first signal having a delay that can be modulated as a function of the conductivity of the memory cell involved in a reading operation.

3. The circuit according to claim 2, wherein the first delay circuit receives a control signal of the memory and emits the first signal, said first signal determining a timing of a beginning of the switching of said equalization signal.

4. The circuit according to claim 2, wherein said second delay circuit receives said first signal having a slope that can be modulated, and outputs a second signal having a slope that can be modulated, said second signal determining the slope of the switching of said equalization signal, as a function of the conductivity of the memory cell involved in the reading operation.

5. The circuit according to claim 2, wherein said second delay circuit receives said first signal having a slope that can be modulated, and outputs said second signal, said second signal determining the slope of the switching of said equalization signal, as a function of the conductivity of the memory cell involved in the reading operation.

6. The circuit according to claim 1, wherein said second delay circuit is adapted to generate a second signal having a slope that can be modulated as a function of the conductivity of the memory cell involved in a reading operation.

7. The circuit according to claim 1, wherein said first delay circuit is driven by a disable/enable signal.

8. The circuit according to claim 7, wherein said second delay circuit is driven by said disable/enable signal.

9. The circuit according to claim 8, wherein said first delay circuit is adapted to generate a first signal having a delay that can be modulated as a function of the conductivity of the memory cell involved in a reading operation.

10. The circuit according to claim 9, wherein said second delay circuit is adapted to generate a second signal having a slope that can be modulated as a function of the conductivity of the memory cell involved in a reading operation.

11. The circuit according to claim 10, wherein the first delay circuit receives a control signal of the memory and emits the first signal, said first signal determining a timing of a beginning of the switching of said equalization signal.

12. The circuit of claim 1, wherein the second reference voltage is constant.

13. A method for modulating data sensing timing for a memory, comprising the steps of:

(A) generating a first voltage that is a function of a conductivity of a memory cell of the memory;

(B) generating a second voltage as reference for said first voltage;

(C) determining a start time of a switching of an equalization signal present in the memory, as a function of the conductivity of the memory cell involved in a reading operation; and (D) determining the slope of the switching of said equalization signal as a function of the conductivity of said memory cell.

14. The method according to claim 13, wherein step (C) is adapted to produce a first signal the delay of which can be modulated as a function of the conductivity of said memory cell, the delay determining the start time of the switching of said equalization signal.

15. The method according to claim 14, wherein step (C) is performed by means of a first circuit for generating a first signal having a delay that can be modulated.

16. The method according to claim 15, wherein step (D) is performed by means of a second circuit for generating a second signal having a slope that can be modulated, wherein the second circuit is adapted to receive said first signal as an input, and the second circuit is adapted to generate an output signal of said second circuit for determining a switching configuration of said equalization signal.

17. The method according to claim 13, wherein step (C) is performed by means of a first circuit for generating a first signal having a delay that can be modulated.

18. The method according to claim 17, wherein step (D) is performed by means of a second circuit for generating a second signal having a slope that can be modulated, wherein the second circuit is adapted to receive said first signal as an input, and the second circuit is adapted to generate an output signal of said second circuit for determining a switching configuration of said equalization signal.

19. The method according to claim 13, wherein step (D) is performed by means of a circuit for generating a second signal having a slope that can be modulated, wherein the circuit is adapted to receive a first signal as an input, and the circuit is adapted to generate an output signal of said circuit for determining a switching configuration of said equalization signal.

20. A data sensing timing modulating circuit for a memory, comprising:

a voltage generating circuit for generating a first voltage that is a function of the conductivity of a memory cell of the memory;

a first delay circuit for receiving the first voltage and for generating a first delay signal, wherein the first delay signal is a function of the first voltage; and a second delay circuit for receiving the first voltage and the first delay signal, and for generating a second delay signal wherein the second delay signal is a function of the first voltage.

21. The circuit of claim 20, wherein the second delay signal modulates a sensitivity of a sensing amplifier.

22. The circuit of claim 21, wherein the first delay signal transitions from zero to one, and a timing of the transition is a function of the first voltage.

23. The circuit of claim 22, wherein the second delay signal is not generated until the first delay signal transitions from zero to one.

24. The circuit of claim 23, wherein a slope of the second delay signal determines the sensitivity of the sensing amplifier.

25. The circuit of claim 24, coupled to the sensing amplifier.

26. The circuit of claim 20, wherein the first delay signal transitions from zero to one, and a timing of the transition is a function of the first voltage.

27. The circuit of claim 20, wherein the second delay signal is not generated until the first delay signal transitions from zero to one.

28. The circuit of claim 21, coupled to the sensing amplifier.

29. The circuit of claim 21, wherein a slope of the second delay signal determines the sensitivity of the sensing amplifier.

30. The circuit of claim 20, wherein the voltage generating circuit also generates a reference voltage received by the first and second delay circuits.

31. The circuit of claim 30, wherein the reference voltage is constant.

* * * * *